United States Patent
Davis et al.

(10) Patent No.: US 8,274,645 B2
(45) Date of Patent: Sep. 25, 2012

(54) METHOD AND APPARATUS FOR IN-SITU METROLOGY OF A WORKPIECE DISPOSED IN A VACUUM PROCESSING CHAMBER

(75) Inventors: Matthew F. Davis, Felton, CA (US); Lei Lian, Fremont, CA (US); Thorsten B. Lill, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 438 days.

(21) Appl. No.: 12/506,155

(22) Filed: Jul. 20, 2009

(65) Prior Publication Data

US 2011/0013175 A1    Jan. 20, 2011

(51) Int. Cl.
*G01N 21/00* (2006.01)
(52) U.S. Cl. ..... 356/72; 250/372; 250/234; 250/559.45; 356/326; 356/320
(58) Field of Classification Search ............ 356/72, 356/326, 320; 250/372, 252.1, 234, 559.41, 250/559.45, 559.27
See application file for complete search history.

(56) References Cited

U.S. PATENT DOCUMENTS

| | | | |
|---|---|---|---|
| 6,377,346 B1 * | 4/2002 | Vaisala et al. | 356/417 |
| RE39,145 E | 6/2006 | Perry et al. | |
| 7,067,819 B2 * | 6/2006 | Janik | 250/372 |
| 7,158,221 B2 | 1/2007 | Davis et al. | |
| 7,442,615 B2 * | 10/2008 | Nguyen et al. | 438/308 |

* cited by examiner

*Primary Examiner* — Gregory J Toatley
*Assistant Examiner* — Iyabo S Alli
(74) *Attorney, Agent, or Firm* — Blakely, Sokoloff, Taylor & Zafman

(57) ABSTRACT

A method and apparatus for in-situ metrology of a workpiece disposed in a vacuum processing chamber. The apparatus may include an optical assembly external to the processing chamber configured to focus a relatively large optical spot over a relatively large working distance to acquire a TE and TM spectra from a periodic array on the workpiece. The workpiece may be disposed in the processing chamber with an arbitrary orientation which is first determined via a reflectance measurement. TE and/or TM spectra may then be acquired by initiating a periodic triggering of a flash lamp based on the determined workpiece orientation to account for variation in placement of the workpiece within the processing chamber. The periodic array from which spectra are collected may be a memory array being fabricated in a semiconductor wafer.

19 Claims, 9 Drawing Sheets

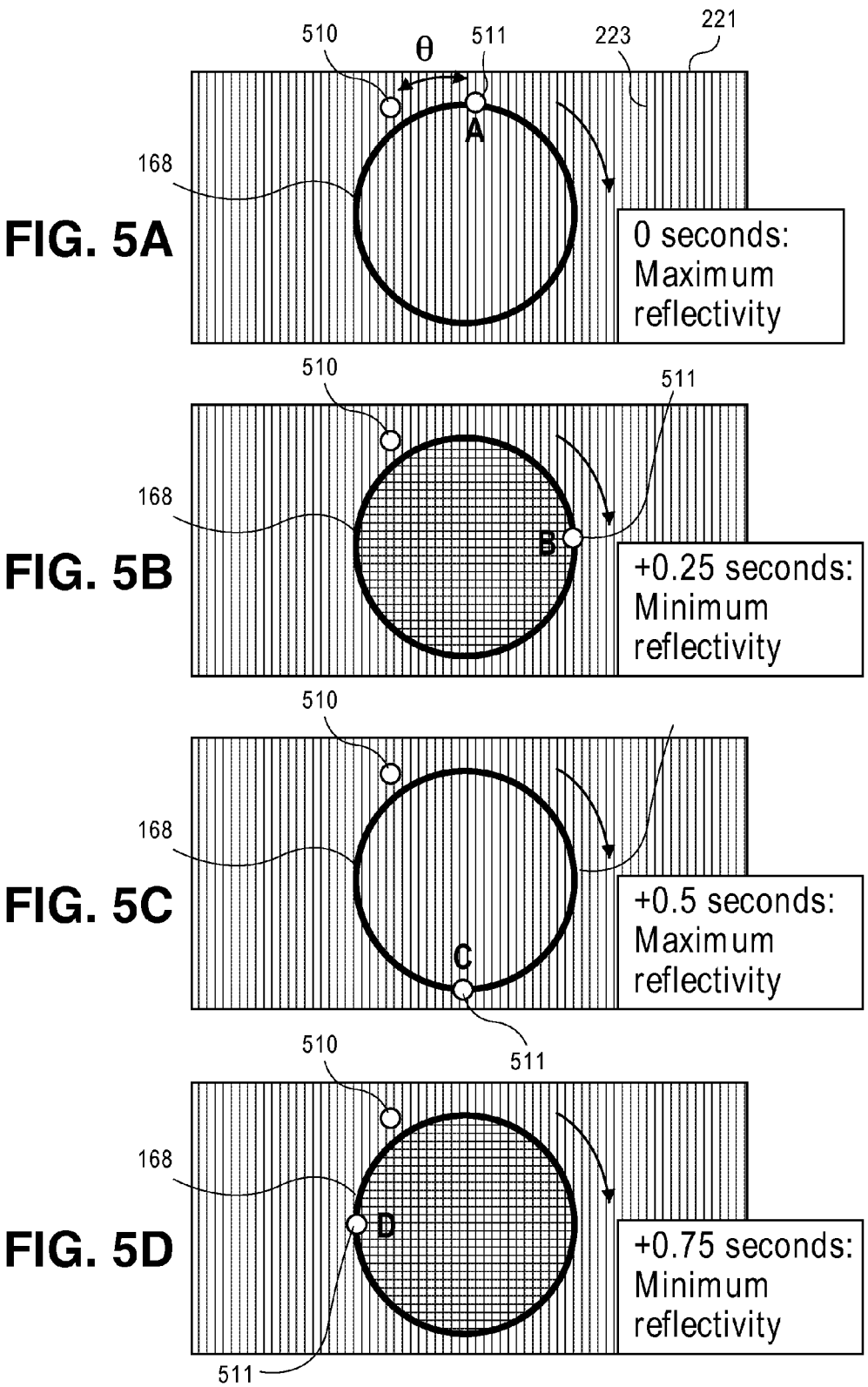

METHOD AND APPARATUS FOR IN-SITU METROLOGY OF A WORKPIECE DISPOSED IN A VACUUM PROCESSING CHAMBER

BACKGROUND

1. Field

Embodiments of the present invention relate to in-situ metrology in a vacuum processing chambers and more particularly to in-situ optical critical dimension (OCD) metrology (e.g., scatterometry) of a workpiece processed in the vacuum processing chamber.

2. Discussion of Related Art

Vacuum processing systems are ubiquitous in semiconductor fabrication. Certain vacuum processing chambers are configured to process a workpiece with a plasma or glow discharge. For example, a plasma etch process may pattern a feature in the workpiece based on a photo lithographically defined pattern. To reduce the feature sizes for a given photo lithographic technology node, a self-aligned double patterning (SADP) method may be employed where controlling a plasma etch process to a critical dimension and/or pitch is determinative. For example, a typical SADP processing includes trimming a mask from a first 1:1 line:space pitch to a 1:3 line:space pitch and then generating, from the trimmed mask, a double patterned spacer mask having reduced critical dimensions and a final line:space pitch of 1:1. As such, SADP processing is highly dependent on plasma etch CD, profile, and/or pitch control.

While critical dimensions of features may be deduced via OCD techniques, the difficulty in positioning an optical probe spot over a diffraction grating test structure with sufficient accuracy has hindered application of true in-situ metrology that can determine pre-etch, during-etch, or post-etch CD. Therefore, to date, OCD metrology has been limited to the integration of a stand-alone metrology station with a plasma processing platform with a workpiece either measured in the metrology module, or processed in the processing chamber, but not processed and measured (concurrently, or otherwise) within a same platform module. As such, compared to a current integrated metrology tool, true in-situ metrology would, for example, improve the throughput of a processing platform because a "pre" and "post" measurement external to the processing chamber becomes unnecessary.

SUMMARY

Embodiments of the present invention describe method and apparatus for in-situ metrology of a workpiece disposed in a vacuum processing chamber. In an embodiment, the apparatus includes an optical assembly external to the processing chamber configured to focus a relatively large optical spot, such as on the order of 0.1 mm, over a relatively large working distance, such as on the order of 50 mm to acquire a TE (transverse electric) and TM (transverse magnetic) spectra from a periodic array on the workpiece, such as a memory array being fabricated on a semiconductor wafer, that is of sufficient size to span the relatively large optical probe spot.

In one embodiment, TE and TM spectra of the periodic array are acquired prior to, during, or subsequent to, the etching of the workpiece, prior to unloading the workpiece from the etch process chamber. In one embodiment, the workpiece is disposed in the etch process chamber with an arbitrary orientation which is first determined through a measurement. Spectra may then be acquired by initiating a periodic triggering of a flash lamp to illuminate the periodic array. In one such embodiment, the periodic flash lamp triggering may be initiated at an appropriate time based on the measured workpiece orientation to account for variation in placement of the workpiece within the processing chamber.

In an embodiment, the orientation of the periodic array is determined by triggering the flash lamp while collecting spectral reflectance data as the linear polarizer is rotated. The spectral reflectance data may then be curve fit to identify reflectance maxima or minima. A phase offset may then be determined between the reflectance maxima or minima and a referenced angular position of the linear polarizer to calibrate the angular position of the linear polarizer to the line of the periodic array.

BRIEF DESCRIPTION OF THE DRAWINGS

Embodiments of the invention are particularly pointed out and distinctly claimed in the concluding portion of the specification. Embodiments of the invention, however, both as to organization and method of operation, together with objects, features, and advantages thereof, may best be understood by reference to the following detailed description when read with the accompanying drawings in which:

FIGS. 5A, 5B, 5C, 5D illustrate an orientation of a polarization axis of a linear polarizer relative to an orientation of a periodic memory array on a workpiece, in accordance with an embodiment;

DETAILED DESCRIPTION

Figure 1:
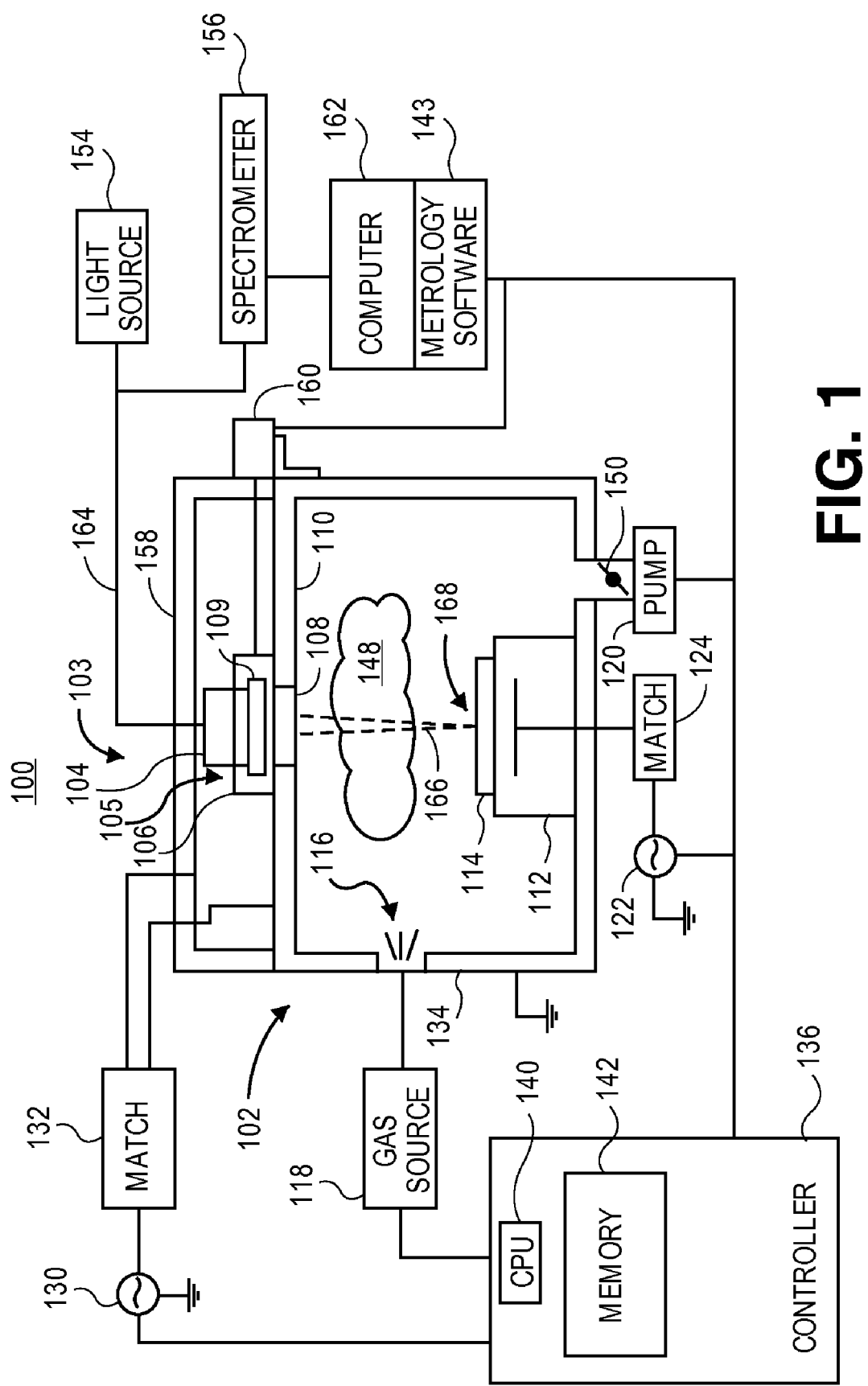
FIG. 1 schematically illustrates a cross-section of a plasma etch system incorporating an in-situ optical metrology apparatus, in accordance with one embodiment.

Embodiments of are described herein with reference to figures. However, particular embodiments may be practiced without one or more of these specific details, or in combination with other known methods, materials, and apparatuses. In the following description, numerous specific details are set forth, such as specific materials, dimensions and processes parameters etc. to provide a thorough understanding of the present invention. In other instances, well-known equipment design and process control techniques have not been described in particular detail to avoid unnecessarily obscuring the present invention. Reference throughout this specification to "an embodiment" means that a particular feature, structure, material, or characteristic described in connection with the embodiment is included in at least one embodiment of the invention. Thus, the appearances of the phrase "in an embodiment" in various places throughout this specification are not necessarily referring to the same embodiment of the invention. Furthermore, the particular features, structures, materials, or characteristics may be combined in any suitable manner in one or more embodiments.

Embodiments include a method and apparatus for performing OCD analysis to monitor a process for fabricating features in a workpiece, such as an integrated circuit (IC) devices on semiconductor substrates, thin film batteries, displays, and the like. The method and apparatus may provide process control by utilizing dimensional information derived from diffraction data collected from a periodic array or grating on workpiece illuminated by a spot of an optical probe. Any or all of a pre-etch, during-etch, and post-etch measurement of a structure formed by the processing chamber may be used to adjust a process recipe of the processing chamber and/or upstream/downstream processing chambers. For example, the method may be used to control a property of an SADP etch process, where any one of an antireflective layer etch, photo resist mask trim, template mask etch, or spacer etch may have an etch duration or other etch process parameter varied in response to an in-situ OCD measurement.

OCD measurements may be performed in-situ using a dynamic optical measuring tool capable of taking measurements at one or more locations on a workpiece in a manner which automatically compensates form variations in workpiece placement within a process chamber. A base location on a workpiece (e.g., a particular IC chip or a particular region of that chip, such as a memory array) that is used for measurements can be changed automatically from process step to process step, workpiece to workpiece, while an offset to either the base location or orientation is determined based on a preliminary measurement of the workpiece by the optical measuring apparatus. In an embodiment, the preliminary measurement includes scanning an X-Y space of the workpiece while monitoring a reflectance signal and/or tracking rotation of a linear polarizer while monitoring a reflectance signal. The optical measuring apparatus is adapted to collect TE and TM spectra for estimation of a dimension of features, such as a line, in the periodic array. In an embodiment, the line is a portion of a memory array which is in the process of being fabricated by the processing chamber.

FIG. 1, schematically illustrates a cross-section of a plasma etch system 100 incorporating an in-situ optical metrology apparatus 103 according to an exemplary embodiment. However, embodiments of the present invention may be adapted to other vacuum processing systems, such as a plasma deposition chamber. The plasma etch system 100 is generally used as a processing module of a larger processing platform, such as, but not limited to, the TRANSFORMA™ system or CENTURA® system, both of which are available from Applied Materials, of Santa Clara, Calif.

In the depicted embodiment, the plasma etch system 100 comprises a process chamber 102, a plasma power source 130, a biasing power source 122, and a controller 136. The process chamber 102 includes a support pedestal 112 within a chamber wall 134. A lid 158 may be additionally provided to house and protect additional components of the in-situ optical metrology apparatus 103. The ceiling 110 includes an electrode coupled through a first matching network 132 to the plasma power source 130. The support pedestal 112 is coupled through a second matching network 124 to the biasing power source 122.

The controller 136 includes a central processing unit (CPU) 140 and a memory 142 and facilitates control of the components of the etch process chamber 102 and, as such, of the etch process, as discussed below in further detail. The controller 136 may be one of any form of general-purpose computer processor that can be used in an industrial setting for controlling various chambers and sub-processors. The memory, or computer-readable medium, 142 or the CPU 140 may be one or more of those further described in reference to FIG. 6. Embodiments of the methods described herein may be generally stored in the memory 142 or in a similar storage medium on the computer 162 as a software routine (e.g., metrology software 143). The metrology software 143 may also be stored and/or executed by a second CPU (not shown) that is remotely located from the hardware being controlled by the CPU 140.

In an etch operation, a workpiece 114 is placed on the support pedestal 112 and process gases are supplied from a gas panel 118 through one or more entry ports 116. A plasma 148 is ignited in the process chamber 102 by applying power from the plasma and/or bias sources 130 and 122. The pressure within the interior of the process chamber 102 is controlled to sub-atmospheric pressure (vacuum) using a throttle valve 150 and a vacuum pump 120. Any vacuum processing chamber may be used to practice the invention, including chambers with remote plasma sources, microwave plasma chambers, electron cyclotron resonance (ECR) plasma chambers, capacitively coupled plasma chambers, and the like.

The in-situ optical metrology apparatus 103 may be configured to perform spectral analysis before, during, and/or after an etch (or deposition, etc.) operation. In an embodiment, the in-situ optical metrology apparatus 103 detects a broad spectrum of reflected or diffracted light to make an estimate of a CD of a feature in a periodic array on the workpiece 114. As illustrated in FIG. 1, the in-situ optical metrology apparatus 103 generally includes an optics assembly 104 coupled to an actuator assembly 105, a broadband (e.g., polychromatic) light source 154, a spectrometer 156, and a computer 162. The computer 162 and controller 136 may be one and the same. However, in one embodiment, the controller 136 is used for controlling the in-situ optical metrology apparatus 103, while the computer 162 is used for in-situ optical data collection and analysis.

The actuator assembly 105 generally includes an X-Y stage assembly 106 and one or more motors 160 adapted to respond to commands from a controller 136 to move the optics assembly 104 to a desired location. The optics assembly 104 generally includes passive optical components, such as a lens, mirrors, beam splitters, and the like as well as a rotatable linear polarization mechanism 109. The optics assembly 104 is disposed over a window 108 formed in the ceiling 110 of the process chamber 102. The window 108 may be fabricated from quartz, sapphire, or other material that is transparent to light produced by the broadband light source 154. The optics assembly 104 guides and focuses light 166 provided by the broadband light source 154 through the window 108 to form a spot of light (optical spot) which illuminates an optical spot 168 of the workpiece 114 disposed on the support pedestal 112 directly below the window and the optics assembly 104.

Figure 2:
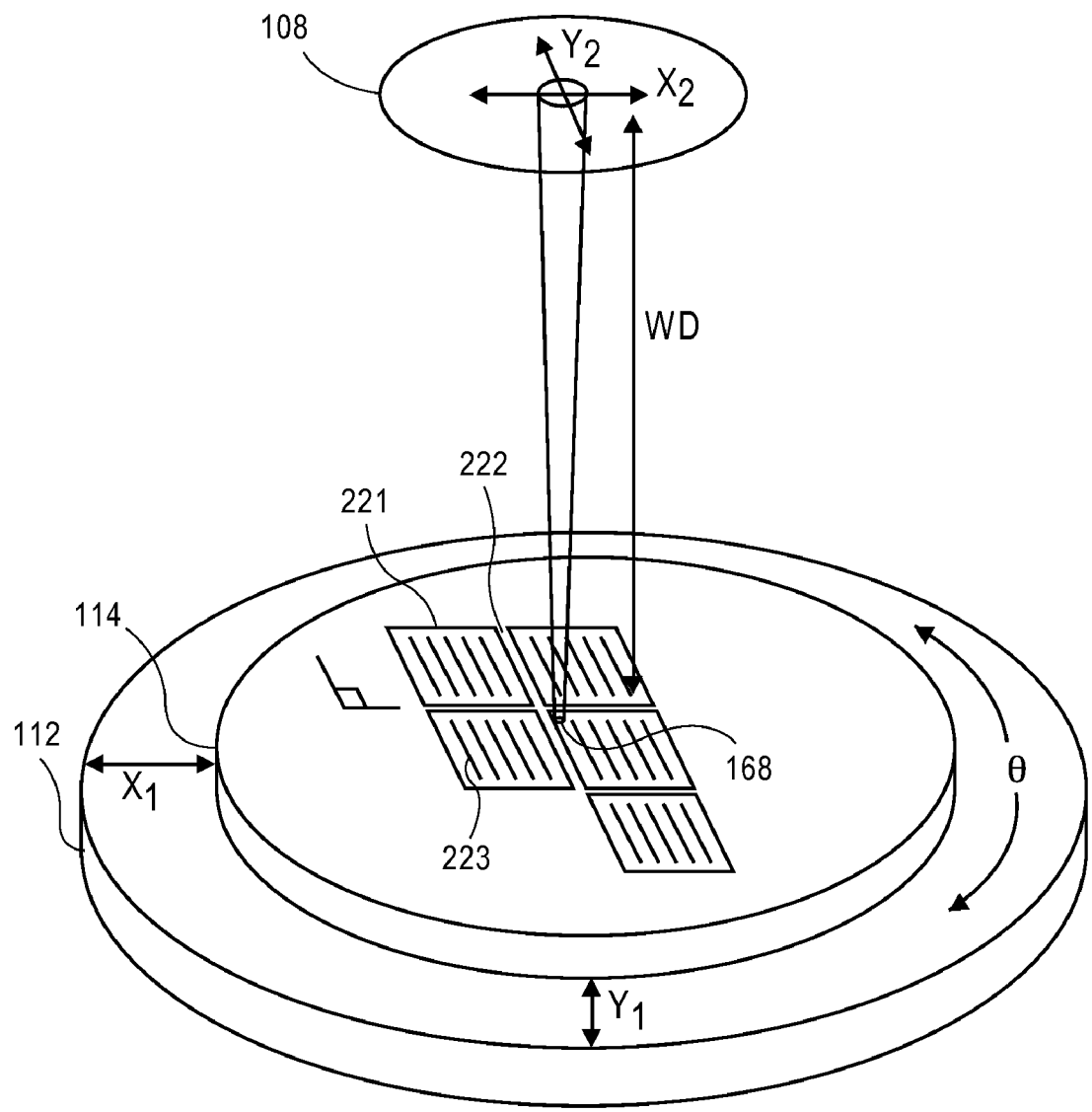
FIG. 2 is an isometric view of a workpiece disposed in the process chamber depicted in FIG. 1 during an in-situ optical metrology event, in accordance with one embodiment.

As depicted in FIG. 2, the optical spot 168 has generally a large enough area to accommodate non-critical focus of one or more of the wavelengths emitted from the broadband light source 154. The size of optical spot 168 is dependent on the quality of optics employed (e.g., the presence or absence of color corrected lenses, etc.) and is a function of the working distance (WD), the spacing between optics assembly 104 and workpiece 114, which is further dependent on the dimensions of the process chamber 102. The optical spot 168 may range in size from about 0.1 to about 10 mm², while the working distance may range from 50 mm to 300 mm, or more. In a particular embodiment where the working distance is between 100 mm and 300 mm, the optical spot 168 has a diameter of approximately 0.5 mm (0.2 mm² area). The optical spot 168 is therefore considerably larger than a probe spot typical in stand-alone or integrated OCD metrology systems, which is on the order of 20 µm in diameter. The relatively large optical spot utilized as described herein is much more managable (as far as placement accuracy, vibration immunity, and cost of optics) for the dimensions of a plasma process chamber (e.g., in the range of 50-300 mm).

As further depicted in FIG. 2, the exemplary workpiece 114 is a semiconductor wafer upon which an integrated circuit (IC) chip 221 is formed as spaced apart from other chips by a scribe line 222. Typically an IC chip 221 comports with a Manhatten layout of the circuitry with features predominantly oriented orthoganally. In a particular embodiment where the IC chip 221 is a memory device, such as a DRAM memory device, periodic memory arrays 223 include alternating lines and spaces. In certain embodiments, the memory arrays 223 are sufficiently large to span at least the entire area of the optical spot (e.g., 0.5 mm in diameter). For such embodiments, it has been found that these large periodic memory arrays 223 may serve as a diffraction grating of sufficient quality to perform OCD measurement. Therefore, because the memory array regions are relatively large in comparison to conventional OCD metrology targets (arrays of lines and spaces in a ~50×50 um square), the memory cell arrays are well suited to the larger spot sizes contemplated in embodiments of the present invention.

Figure 3:
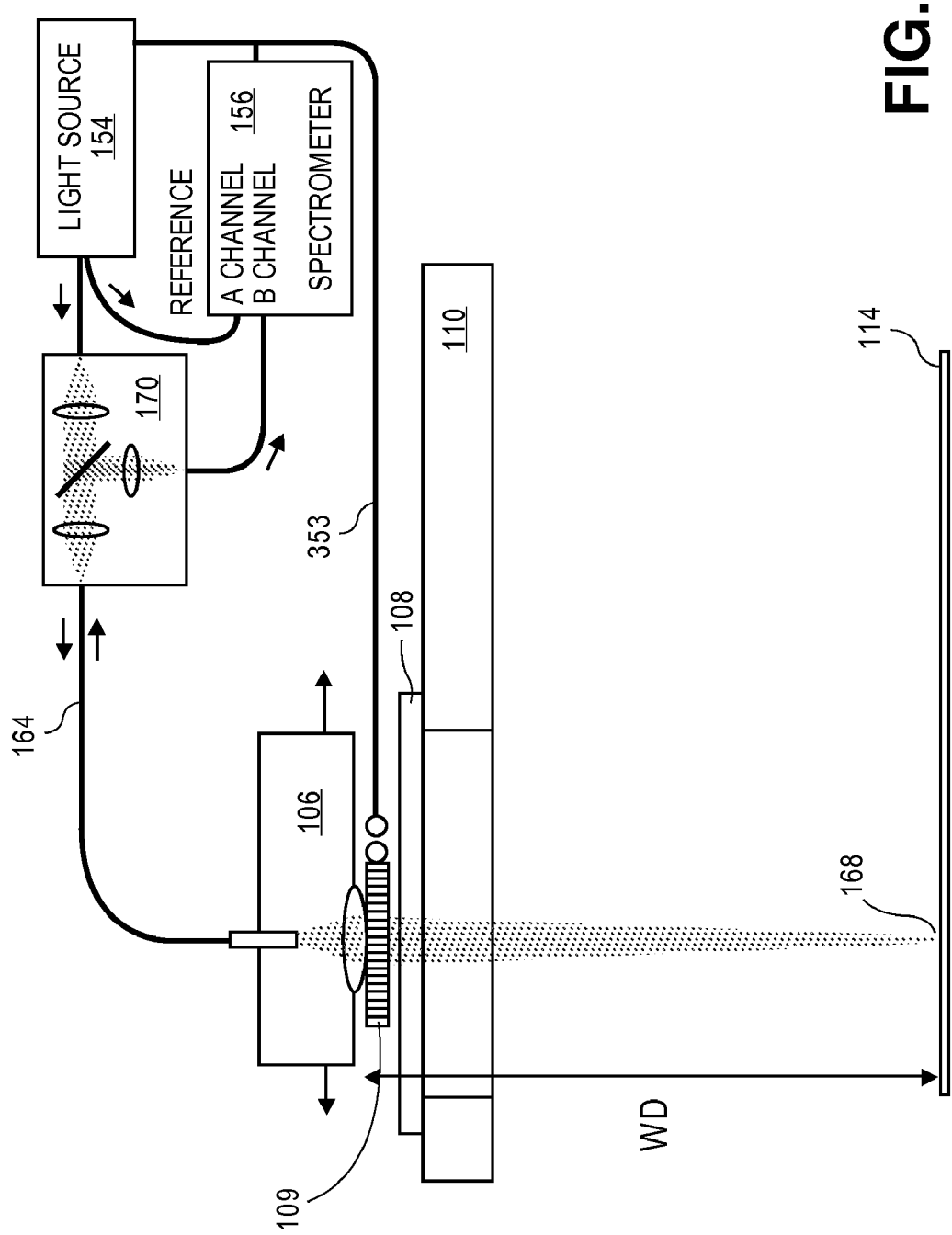
FIG. 3 is a functional block diagram further illustrating components of the in-situ metrology apparatus depicted in FIG. 1, in accordance with one embodiment.

FIG. 3 is a functional block diagram further illustrating components of the in-situ metrology apparatus depicted in FIG. 1. The broadband light source 154 is generally a source of light having a wavelength spectrum in the range from about 200 to about 800 nm. Such a broadband light source 154 may include, for example, a mercury (Hg), xenon (Xe), or Hg—Xe lamp, a tungsten-halogen lamp, and the like. In one embodiment, the broadband light source 154 is a xenon flash lamp. Light reflected from the illuminated optical spot 168 is collected and guided by the optics assembly 104 via a beam splitter 170 to the spectrometer 156. The spectrometer 156 detects a broad spectrum of wavelengths of light. The spectrometer 156 has two channels with an A channel providing a reference which can be used to normalize spectral data to account for pulse to pulse intensity variation typical of flash lamps. Output from the spectrometer 156 is delivered to the computer 162 (see FIG. 1) for analysis. In an exemplary embodiment, the optical interface between the optics assembly 104, the broadband light source 154, and the spectrometer 156 may be provided using a fiber-optic array 164.

A rotating polarization mechanism 109 includes a linear polarizer coupled to an encoder. A trigger line 353 couples the rotating polarization mechanism 109 to the broadband light source 154 and, optionally, the spectrometer 156. As further illustrated in FIG. 2, the workpiece 114 may be disposed upon the support pedestal 112 with an arbitrary angular orientation (θ) and an arbitrary linear displacement along the axis ($X_1$) and ($Y_1$). Generally, the orientation (angular displacement) and linear displacement of the workpiece is a function of variability in robotic placement of the workpiece in the process chamber 102 as defined with teach points on a per-chamber basis. Even though relatively large, the optical spot 168 must still be accurately positioned on a wafer so as to illuminate the highly periodic (and small design rule) memory array area rather than less periodic (and large design rule) driver or scribe lines 222. The rotating polarization mechanism 109 is therefore to trigger or pulse the light source at the appropriate angle of polarization relative to an arbitrary workpiece orientation within the process chamber 102 to collect TE and/or TM spectra when a line of the periodic memory array 223 (FIG. 2) is substantially parallel or orthogonal to the polarization axis of the linear polarizer.

Figure 4A:
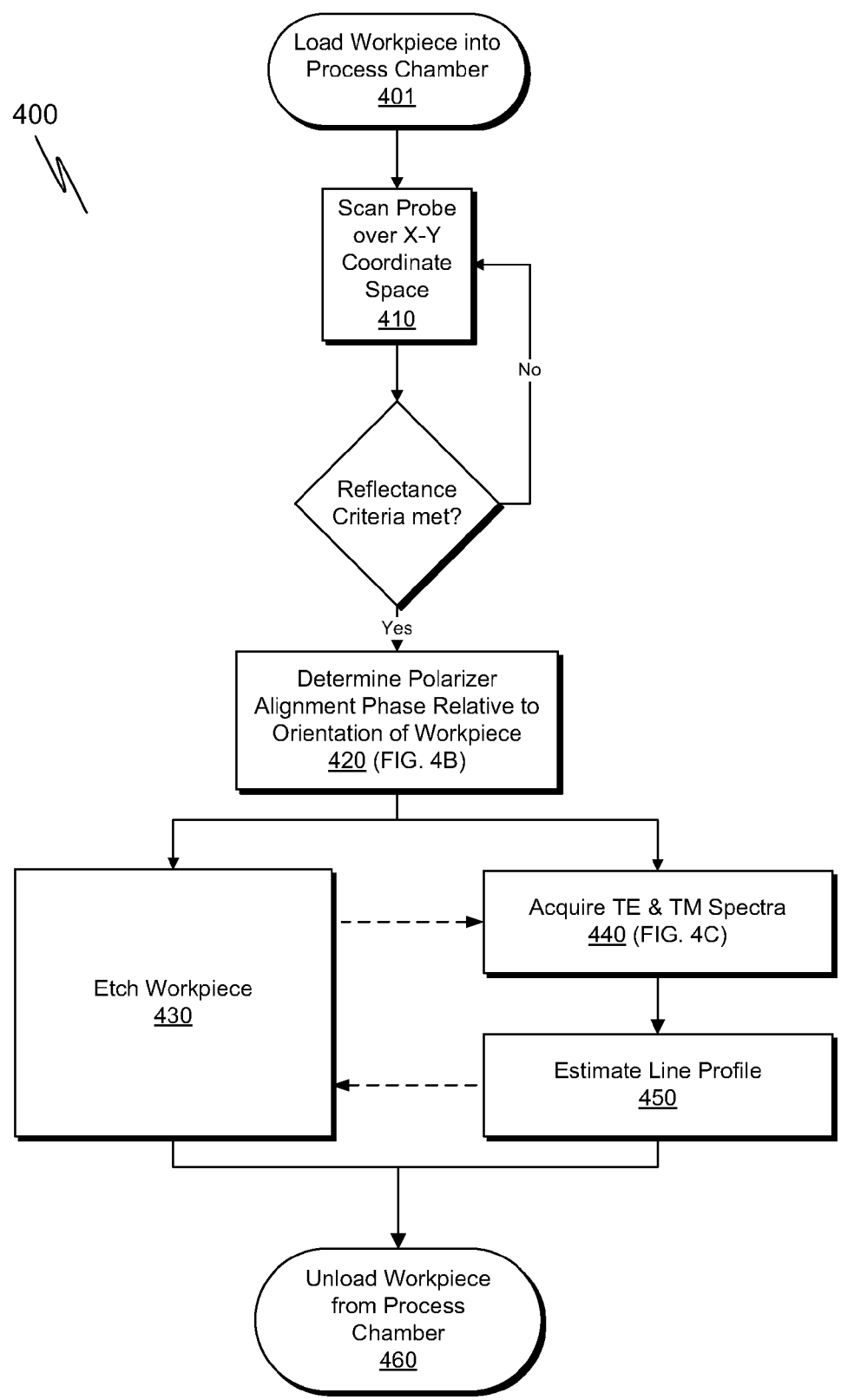
FIG. 4A illustrates a flow diagram for an exemplary method for in-situ metrology of a workpiece disposed in a process chamber as depicted in FIG. 1, in accordance with an embodiment.

FIG. 4A illustrates an exemplary in-situ metrology method 400 which may be performed on a workpiece disposed in a process chamber, such as the process chamber 102 depicted in FIG. 1. Method 400 begins with loading a workpiece into the process chamber at operation 401. Prior to initiation of a particular etch process in the process chamber 102, the probe beam spot is manipulated while monitoring reflectivity of the optical spot 168 for the correct signature to actively confirm workpiece-probe alignment.

At operation 410, the optical probe is driven to the initial "base" position and scanned over an X-Y coordinate space there about while the light source 154 is illuminated (periodically flashed). Linear positioning of the optical spot 168 may delivered with the X-Y stage assembly 106 substantially as described in commonly assigned U.S. Pat. No. 7,158,221, filed by Davis et al. on Dec. 23, 2003. In one embodiment of the invention, the total movement range of the X-Y stage assembly 106 encompasses at least the dimensions of one full chip 221, such that all of the positions of the die can be accessed for measurement. In one specific embodiment, the X-Y stage assembly 106 provides a range of motion in a square area of about 33 millimeters by about 33 millimeters. The motor 160 which moves the stage therefore may have a "base" position set by process recipe so that each unique memory product that is etched in the chamber can have a unique spot placement. The controller 136 or computer 162 may direct the in-situ optical metrology apparatus 103 to scan, from the initial base position, across an X-Y coordinate space of the workpiece 114 while collecting reflectance data from the workpiece as illuminated by the optical spot. The in-situ optical metrology apparatus 103 may scan for the target using any known scanning algorithm. In one embodiment, the in-situ optical metrology apparatus 103 moves in an outward spiral pattern from the base position while the reflected light received by the spectrometer 156 is compared it to a preprogrammed pattern or signal until the desired target is found (e.g., optical spot 168 illuminates only the memory array 223). The spectrometer 156 collects reflectance data which is analyzed by computer 162 to determine satisfaction of reflectance criteria and position the optical spot 168 over a target, such as periodic memory array 223.

At operation 420, the polarizer alignment phase relative to the orientation of the workpiece 114 is determined. The workpiece 114 is typically flat aligned to between 0.5 and 1 degree of an arbitrary orientation. In one embodiment, in contrast to conventional stand alone or integrated OCD systems which utilize a camera that creates an image of the workpiece and perform image recognition to determine an orientation of the workpiece, absolute wafer reflectance is compared against a reference as described further in reference to FIG. 4B to determine the polarizer alignment phase.

Following the linear positioning and/or calibration of the polarizer alignment phase, the method 400 proceeds to operation 430 or operation 440 where the workpiece is either etched or a "pre" OCD measurement is performed, respectively. In method 400, operations 430, 440 and 450 may be performed in parallel or in series in any sequence to provide, pre-etch, during-etch, or post-etch CD estimates. In a particular embodiment, real-time scatterometry may be performed while the plasma 148 is ignited during an etch of the workpiece to track evolution of an etch profile. At operation 440, any etch process known in the art may be performed, including any of the SADP etches described elsewhere herein. At operation 440 TE and TM spectra are acquired by the in-situ optical metrology apparatus 103, as further described in reference to FIG. 4C. At operation 450, an estimate of a profile of a line in the target periodic array (e.g., periodic memory array 223) is determined based on the acquired TE and TM spectra. Any scatterometry method known in the art which is compatible with the light source 154, spectrometer 156, and other components of the in-situ optical metrology apparatus 103 may be employed. For example, library-based or real time scatterometry alogirthms may be employed by computer 162 or other network computer(s) to derive a line profile from which a line and/or space CD of the memory array 223 may be estimated. Subsequent to the in-situ OCD measurement, the workpiece is removed out of the process chamber at operation 460 to complete method 400.

Figure 4B:
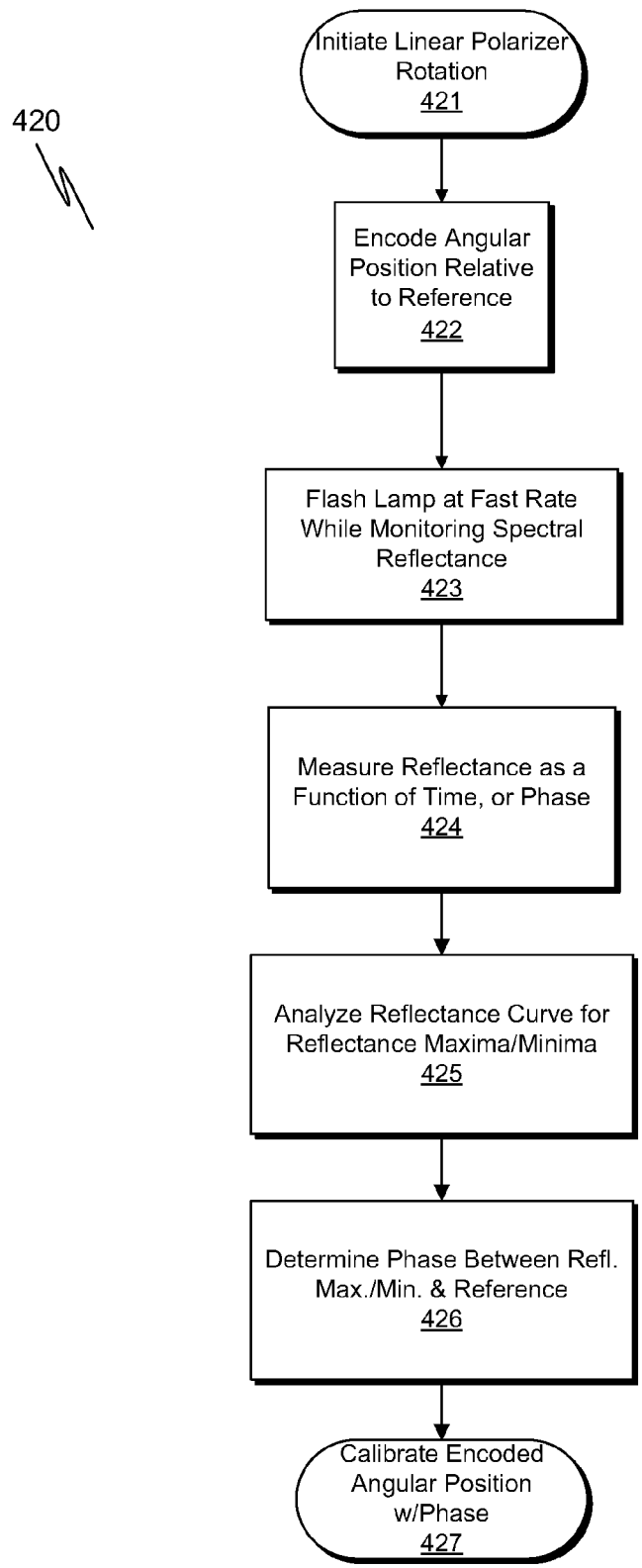
FIG. 4B illustrates a flow diagram for an exemplary method for determining an orientation of a workpiece disposed in a process chamber as depicted in FIG. 1 and FIG. 2, in accordance with an embodiment.

FIG. 4B further illustrates the polarizer alignment operation 420 depicted in FIG. 4A as one exemplary reflectance-based method for determining an orientation of a workpiece disposed in the plasma etch chamber as depicted in FIG. 1 and FIG. 2. The discussion of FIG. 4B references FIGS. 5A, 5B, 5C and 5D, which illustrate an orientation of a polarization axis of a linear polarizer relative to an orientation of a periodic array (e.g., a memory array) on a workpiece.

At operation 421, the rotation of the linear polarizer in the rotating polarization mechanism 109 is initiated. As further depicted in FIG. 5A, a reference pulse 510 is provided in the rotating polarization mechanism 109. In one embodiment, the reference pulse 510 is an edge of a voltage output by an optical detector coupled to the rotating polarization mechanism 109. At operation 422, the angular displacement (θ) of the linear polarizer between the current angular position 511 and the encoded position of the reference pulse 510 is determined. While the polarizer is rotating, alignment phase data is collected by triggering the light source 154 at operation 423 at a sufficiently high rate to collect reflectance data at operation 424 as a function of time or phase. In an embodiment, at operation 423, the light source 154 is triggered (flashed) at approximately 40 Hz in open loop mode while there is no plasma 148 ignited in the process chamber 102 (e.g., prior to striking a plasma and/or after extinguishing a plasma).

Figure 5E:
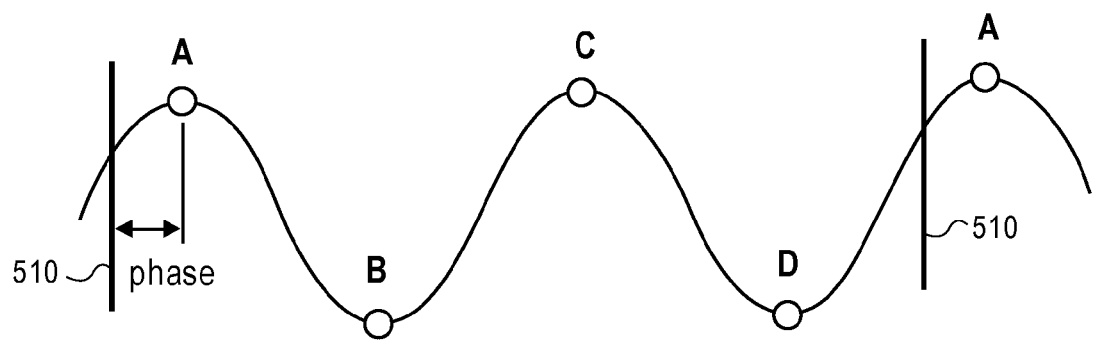
FIG. 5E illustrates fitting of a reflectance curve corresponding to the polarization axis orientations depicted in FIGS. 5A, 5B, 5C and 5D.

As depicted in FIGS. 5A, 5B, 5C and 5D, as the polarization axis of the optical spot 168 aligns with the periodic memory array 223, the absolute reflectance varies approximately sinusoidally, as illustrated in FIG. 5E. Depending on the rate of polarizer rotation and flash frequency, between 5 and 50 data samples, or more, may be collected for each quarter rotation. For example, with a flash rate of 40 Hz and a 1 Hz polarizer rotation rate, 10 samples are collected per quarter rotation. At operation 425, the reflectance data is collected to identify a reflectance maxima and/or reflectance minima which correspond to the polarization axis being parallel or orthogonal to lines in the periodic memory array 223, as illustrated in FIGS. 5A-5E. Because the fast flash rate of operation 423 may not provide an exact determination of the phase alignment, an alignment algorithm may solve for the phase to resolution of 10 mSec, or approximately 1% of total rotation to provide sufficient alignment accuracy for scatterometry measurements to be performed on the workpiece 114. Any conventional curve fitting routine may be employed by the alignment algorithm at operation 425. At operation 426, the phase (angular displacement) between the reflectance maxima (minima, etc.) and the reference 510 is determined. Completing the reflectance-based polarizer alignment method at operation 427, the encoded angular position of the rotating polarization mechanism 109 is calibrated to accommodate the determined alignment phase.

Figure 4C:
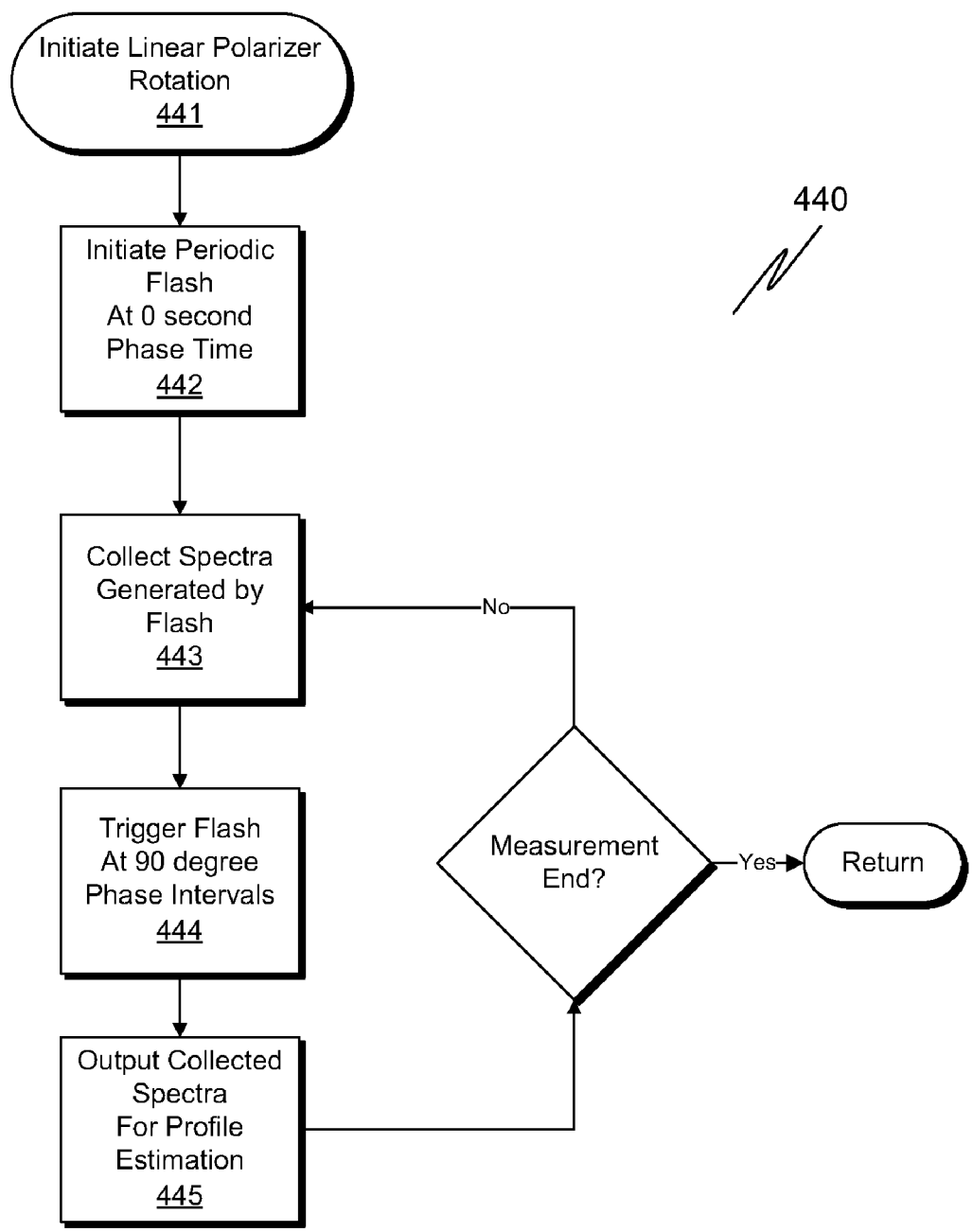
FIG. 4C illustrates a flow diagram for an exemplary method for collecting TE and TM spectra that are synchronized to an orientation of a workpiece, in accordance with an embodiment.

FIG. 4C further illustrates the acquisition operation 440 depicted in FIG. 4A as one exemplary method for collecting TE and TM spectra at instants in time determined based on the reflectance spectra collected during the polarizer alignment operation 420 (FIG. 4B). As such, TE and TM spectra acquisition is synchronized to an arbitrary orientation of a workpiece for output to a line/space CD estimator (e.g., computer 162). As illustrated in FIG. 4C, acquisition begins with initiation of rotation of the linear polarizer at operation 441. At operation 442, using the determined alignment phase, a periodic flash of the light source 145 is initiated at 0 second phase time (e.g., point A in FIG. 5A). A spectra generated the flash is collected at operation 443. At operation 444, the flash lamp is then flashed at 90 degree phase intervals (points B,C,D in FIGS. 5B, 5C and 5D, etc.) to collect both TE and TM spectra. In one such embodiment where the linear polarizer has a rotation rate of 1 Hz, the flash lamp is triggered at 250 ms intervals to collect spectral data at a rate of 2 Hz TM and 2 Hz TE, interlaced (e.g., two TM and two TE spectra with each full polarizer rotation). At operation 445, the collected data is output to the estimation of the line profile at operation 450 (returning to FIG. 4A).

Because the acquisition operation 440 may be performed during an etch process, a minimum acquisition integration time may be desirable to minimize plasma light contributions. The flash duration may therefore be less than 1 ms in duration. In further embodiment, one or both of the plasma power source 130 or biasing power source 122 is pulsed, at a rate between about 1 Hz and 200 kHz, in a manner synchronized with a flash of the light source 154 to further minimize plasma light contributions to the in-situ TE and TM spectra collection. For example, initiation of a plasma pulse controlled by the controller 136 may be timed to occur with the zero second phase time illustrated in FIG. 5A as determined during reflectance measurements performed prior to initiating an etch by computer 162 and communicated to controller 136. Alternatively, the flash lamp trigger rate may also be configured by the computer 162 to occur at a rate corresponding to (e.g., equal to or a multiple of) a plasma pulse rate to be controlled by the controller 136 and synchronized with the plasma pulses to collect spectra when plasma light emission is reduced.

Figure 6:
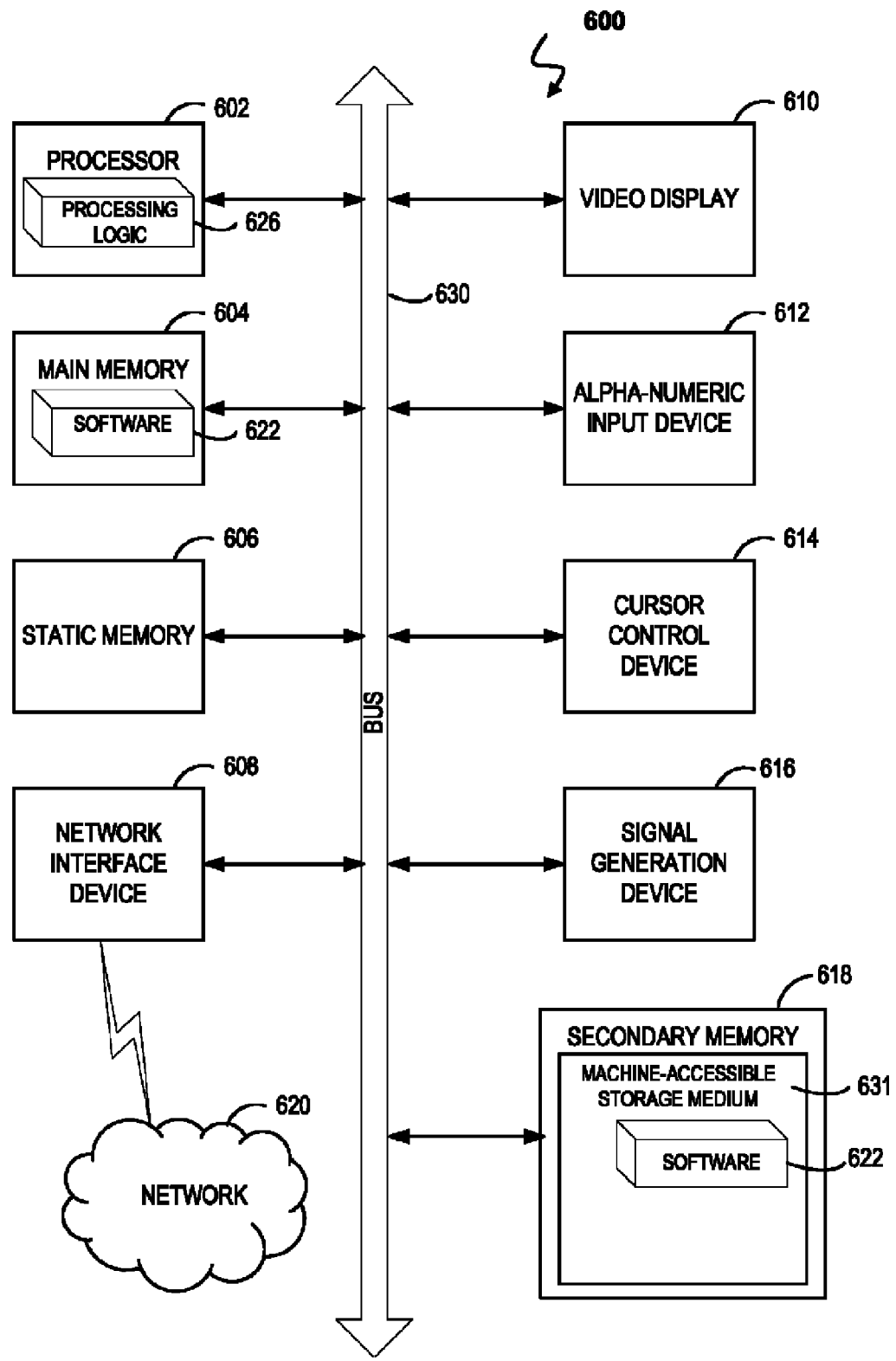
FIG. 6 illustrates a block diagram of an exemplary computer system, in accordance with one embodiment of the present invention.

FIG. 6 illustrates a diagrammatic representation of the exemplary form of a computer system 600 within which a set of instructions, for causing a vacuum processing apparatus to perform any one or more of the methodologies discussed herein, may be executed. For example, the computer system 600 may be utilized as either the controller 136 or the computer 162 depicted in FIG. 1. The exemplary computer system 600 includes a processor 602, a main memory 604 (e.g., read-only memory (ROM), flash memory, dynamic random access memory (DRAM) such as synchronous DRAM (SDRAM) or Rambus DRAM (RDRAM), etc.), a static memory 606 (e.g., flash memory, static random access memory (SRAM), etc.), and a secondary memory 618 (e.g., a data storage device), which communicate with each other via a bus 630.

Processor 602 represents one or more general-purpose processing devices such as a microprocessor, central processing unit, or the like. More particularly, the processor 602 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processor 602 may also be one or more special-purpose processing devices such as an application specific integrated circuit (ASIC), a field programmable gate array (FPGA), a digital signal processor (DSP), network processor, or the like. Processor 602 is configured to execute the processing logic 626 for performing the operations and steps discussed herein.

The computer system 600 may further include a network interface device 608. The computer system 600 also may include a video display unit 610 (e.g., a liquid crystal display (LCD) or a cathode ray tube (CRT)), an alphanumeric input device 612 (e.g., a keyboard), a cursor control device 614 (e.g., a mouse), and a signal generation device 616 (e.g., a speaker).

The secondary memory 618 may include a machine-accessible storage medium (or more specifically a computer-readable storage medium) 631 on which is stored one or more sets of instructions (e.g., software 622) embodying any one or more of the methodologies or functions described herein. The software 622 may also reside, completely or at least partially, within the main memory 604 and/or within the processor 602 during execution thereof by the computer system 600, the main memory 604 and the processor 602 also constituting machine-readable storage media. The software 622 may further be transmitted or received over a network 620 via the network interface device 608.

Embodiments of the present invention may be provided as a computer program product, which may include a computer readable storage medium having stored thereon instructions, which when executed by controller, cause the plasma etch system 100 to process a workpiece and perform optical metrology to acquire TE and/or TM spectra for OCD measurement of the workpiece while disposed in the plasma etch system 100. The in-situ optical metrology apparatus 103, as controlled by the controller 136 or computer 162 in response to the instructions stored on the computer-readable storage medium to perform any of the methods describe herein.

The term "machine-readable storage medium" shall also be taken to include any medium that is capable of storing or encoding a set of instructions for execution by the machine and that cause the machine to perform any one or more of the methodologies of the present invention. The term "machine-readable storage medium" shall accordingly be taken to include, but not be limited to, floppy diskettes, optical disks, CD-ROMs (compact disk read-only memory), and magneto-optical disks, ROMs (read-only memory), RAMs (random access memory), EPROMs (erasable programmable read-only memory), EEPROMs (electrically-erasable programmable read-only memory), magnet or optical cards, flash memory, or other commonly known types of computer-readable medium suitable for storing electronic instructions. Moreover, the present invention may also be downloaded as a computer program product, wherein the program may be transferred from a remote computer to a requesting computer over a wire.

It is to be understood that the above description is intended to be illustrative, and not restrictive. Many other embodiments will be apparent to those of skill in the art upon reading and understanding the above description. Although the present invention has been described with reference to specific exemplary embodiments, it will be recognized that the invention is not limited to the embodiments described, but can be practiced with modification and alteration within the spirit and scope of the appended claims. Accordingly, the specification and drawings are to be regarded in an illustrative sense rather than a restrictive sense. The scope of the invention should, therefore, be determined with reference to the appended claims, along with the full scope of equivalents to which such claims are entitled.

What is claimed is:

1. A vacuum processing apparatus for obtaining in-situ scatterometry data comprising:
    a process chamber configured to perform a plasma process on a workpiece disposed at an arbitrary fixed orientation;
    an optics assembly to focus an optical spot having an area smaller than the workpiece onto a periodic array disposed on the workpiece while the workpiece is disposed in the process chamber;
    a linear polarizer in an optical path of the optics assembly and to rotate a polarization axis through a plurality of angular positions relative to the fixed workpiece orientation;
    a flash lamp coupled to the optical path to periodically illuminate the periodic array within the optical spot;
    a trigger line to trigger the flash lamp when the polarizer is rotated to a predetermined angular position relative to the fixed workpiece orientation; and
    a spectrometer to output reflectance spectra collected from the periodic array when periodically illuminated by the flash lamp.

2. The vacuum processing apparatus as in claim 1, further comprising:
    a processor to determine the angular position where the polarization axis is aligned parallel or orthogonal to the line in the periodic array based on a correlation between the angular position and absolute reflectance data collected over the plurality of angular positions.

3. The vacuum processing apparatus as in claim 2, wherein the processor is to calibrate the angular position of the linear polarizer to an orientation of the workpiece based on a fit of a reflectance curve as measured at the plurality of linear polarizer orientations and correlated to a reference angular position of the linear polarizer.

4. The vacuum processing apparatus as in claim 1, wherein the optical spot is illuminated with polychromatic light and has a diameter of at least 0.5 mm.

5. The vacuum processing apparatus as in claim 4, wherein the optics assembly is disposed outside of the process chamber and has a working distance greater than at least 100 mm.

6. The vacuum processing apparatus as in claim 1, further comprising:
    an actuator assembly adapted to move the optics assembly and scan the optical spot across an X-Y coordinate space of the workpiece disposed on the pedestal while collecting reflectance data from the workpiece as illuminated by the optical spot, and wherein the apparatus further comprises a processor is to distinguish the periodic array from a less periodic region on the workpiece based on the collected reflectance data.

7. The vacuum processing apparatus as in claim 1, wherein the flash lamp is to be triggered four times during each full rotation of the linear polarizer.

8. The vacuum processing apparatus as in claim 7, further comprising a processor to receive a first and a second TE spectra and a first and a second TM spectra with the four flash lamp pulses and to generate an estimate of a dimension of a line in the periodic array.

9. A method for performing in-situ scatterometry on a workpiece disposed in a vacuum processing chamber, comprising:
    loading a workpiece into a vacuum processing chamber;
    periodically illuminating, with an optical spot of an in-situ metrology system, a periodic array disposed on the workpiece;

calibrating an angular position of a linear polarizer in the metrology system to a line of the periodic array based on a variation in reflectance data collected from the optical spot as the polarizer is rotated through a plurality of angular positions;

processing the workpiece with a plasma;

acquiring a TE and TM spectra of the periodic array prior to, during, or subsequent to, the processing of the workpiece, wherein the spectra is acquired in response to triggering illumination of the array with the optical spot when the polarizer is rotated to the calibrated angular position at which the polarization axis is parallel or orthogonal to the line in the array; and unloading the workpiece from the vacuum processing chamber.

10. The method as in claim 9, wherein the workpiece is a semiconductor wafer and where the periodic array is a memory cell array of a microelectronic chip formed in the semiconductor wafer.

11. The method as in claim 10, wherein the optical spot has a diameter of at least 0.5 mm and wherein the memory cell array spans the entire area of the illuminated spot.

12. The method as in claim 11, wherein the optical spot is focused over a working distance greater than at least 100 mm.

13. The method as in claim 9, further comprising scanning the optical spot across an X-Y coordinate space of the workpiece while monitoring the reflectivity of the illuminated optical spot to align the optical spot over the periodic array.

14. The method as in claim 9, wherein triggering the illumination further comprises triggering a flash lamp when the linear polarizer is at an angle of polarization approximately parallel or orthogonal to the line of the periodic array.

15. The method as in claim 14, wherein calibrating the angular position of linear polarizer to the orientation of line in the periodic array further comprises:

triggering the flash lamp while collecting spectral reflectance data as the linear polarizer is rotated;

analyzing the spectral reflectance data to identify a reflectance maxima or a reflectance minima; and determining a phase between the reflectance maxima or minima and an angular reference position of the linear polarizer.

16. The method as in claim 14, wherein a duration of one flash lamp flash is less than 1 ms.

17. The method as in claim 14, wherein the flash lamp is triggered four times with each full rotation of the linear polarizer.

18. The method as in claim 15, further comprising:

receiving a first and second TE spectra and a first and second TM spectra with each four flash lamp pulses.

19. A computer readable medium, with instructions stored thereon, which when executed by a computer processor of a system, cause the system to perform the method of claim 9.

* * * * *